United States Patent
Campbell et al.

(10) Patent No.: US 9,210,830 B2
(45) Date of Patent: Dec. 8, 2015

(54) IMMERSION-COOLED AND CONDUCTION-COOLED METHOD FOR ELECTRONIC SYSTEM

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Amonk, NY (US)

( * ) Notice: Subject to any disclaimer, the term of this patent is extended or adjusted under 35 U.S.C. 154(b) by 374 days.

(21) Appl. No.: 13/758,166

(22) Filed: Feb. 4, 2013

(65) Prior Publication Data
US 2014/0146468 A1 May 29, 2014

Related U.S. Application Data

(63) Continuation of application No. 13/684,712, filed on Nov. 26, 2012, now Pat. No. 8,947,873.

(51) Int. Cl.
*G06F 1/16* (2006.01)
*H05K 5/00* (2006.01)
(Continued)

(52) U.S. Cl.
CPC .............. *H05K 7/20236* (2013.01); *G06F 1/20* (2013.01); *H05K 7/203* (2013.01); *H05K 7/2079* (2013.01); *H05K 7/20318* (2013.01); *H05K 7/20336* (2013.01); *H05K 7/20809* (2013.01)

(58) Field of Classification Search
CPC .................................. G06F 1/20; G06F 1/206
USPC ............................ 361/679.47, 679.52, 679.53
See application file for complete search history.

(56) References Cited

U.S. PATENT DOCUMENTS

| 4,970,868 A | 11/1990 | Grebe et al. |
| 5,023,695 A | 6/1991 | Umezawa et al. |

(Continued)

OTHER PUBLICATIONS

Chu et al., "Advanced Cooling Technology for Leading-Edge Computer Products", Solid-State and Integrated Circuit Techology, 5th International Conference on IEEE Proceedings, pp. 559-562 (1998).

(Continued)

*Primary Examiner* — Anthony Haughton
(74) *Attorney, Agent, or Firm* — Steven Chiu, Esq.; Kevin P. Radigan, Esq.; Heslin Rothenberg Farley & Mesiti P.C.

(57) ABSTRACT

A method of facilitating cooling of an electronics board having a plurality of electronic components mounted to the board by providing an apparatus which includes an immersion-cooled electronic component section and a conduction-cooled electronic component section. The immersion-cooled section includes an enclosure at least partially surrounding and forming a compartment about multiple electronic components of the electronic components mounted to the electronics board, and a fluid disposed within the compartment. The multiple electronic components are, at least in part, immersed within the fluid to facilitate immersion-cooling of those components. The conduction-cooled electronic component section includes at least one electronic component of the electronic components mounted to the electronics board, and the at least one electronic component is indirectly liquid-cooled, at least in part, via conduction of heat from the at least one electronic component.

15 Claims, 15 Drawing Sheets

(51) Int. Cl.
  *H05K 7/00* (2006.01)
  *H05K 7/20* (2006.01)
  *G06F 1/20* (2006.01)

(56) References Cited

U.S. PATENT DOCUMENTS

| | | | |
|---|---|---|---|
| 5,245,508 | A | 9/1993 | Mizzi |
| 5,305,184 | A | 4/1994 | Andresen et al. |
| 5,720,338 | A | 2/1998 | Larson et al. |
| 6,019,167 | A | 2/2000 | Bishop et al. |
| 6,055,157 | A | 4/2000 | Bartilson |
| 6,111,749 | A | 8/2000 | Lamb et al. |
| 7,295,447 | B2 * | 11/2007 | Strmiska et al. ............ 361/798 |
| 7,365,982 | B2 | 4/2008 | He |
| 7,403,392 | B2 | 7/2008 | Attlesey et al. |
| 7,609,518 | B2 | 10/2009 | Hopton et al. |
| 7,656,025 | B2 | 2/2010 | Laquer et al. |
| 7,957,137 | B2 | 6/2011 | Prasher |
| 7,983,040 | B2 * | 7/2011 | Campbell et al. ............ 361/699 |
| 8,018,720 | B2 | 9/2011 | Campbell et al. |
| 8,179,677 | B2 | 5/2012 | Campbell et al. |
| 2009/0284924 | A1 | 11/2009 | Konshak et al. |
| 2011/0182033 | A1 | 7/2011 | Tissot et al. |
| 2012/0279233 | A1 | 11/2012 | Chainer et al. |
| 2012/0279686 | A1 | 11/2012 | Chainer et al. |
| 2012/0281358 | A1 | 11/2012 | Chainer et al. |
| 2014/0146467 | A1 | 5/2014 | Campbell et al. |

OTHER PUBLICATIONS

L. Campbell et al., "Immersion-Cooled and Conduction-Cooled Electronic System", U.S. Appl. No. 13/684,712, filed Nov. 26, 2012.

Chu et al., "Advanced Cooling Technology for Leading-Edge Computer Products", Solid-State and Integrated Circuit Techology, 5th International Conference on IEEE Proceedings, pp. 559-562 (Oct. 21-23, 1998).

Campbell et al., Notice of Allowance for U.S. Appl. No. 13/684,712, filed Nov. 16, 2012 (U.S. Patent Publication No. 2014/0146467 A1), dated Sep. 26, 2014 (9 pages).

* cited by examiner

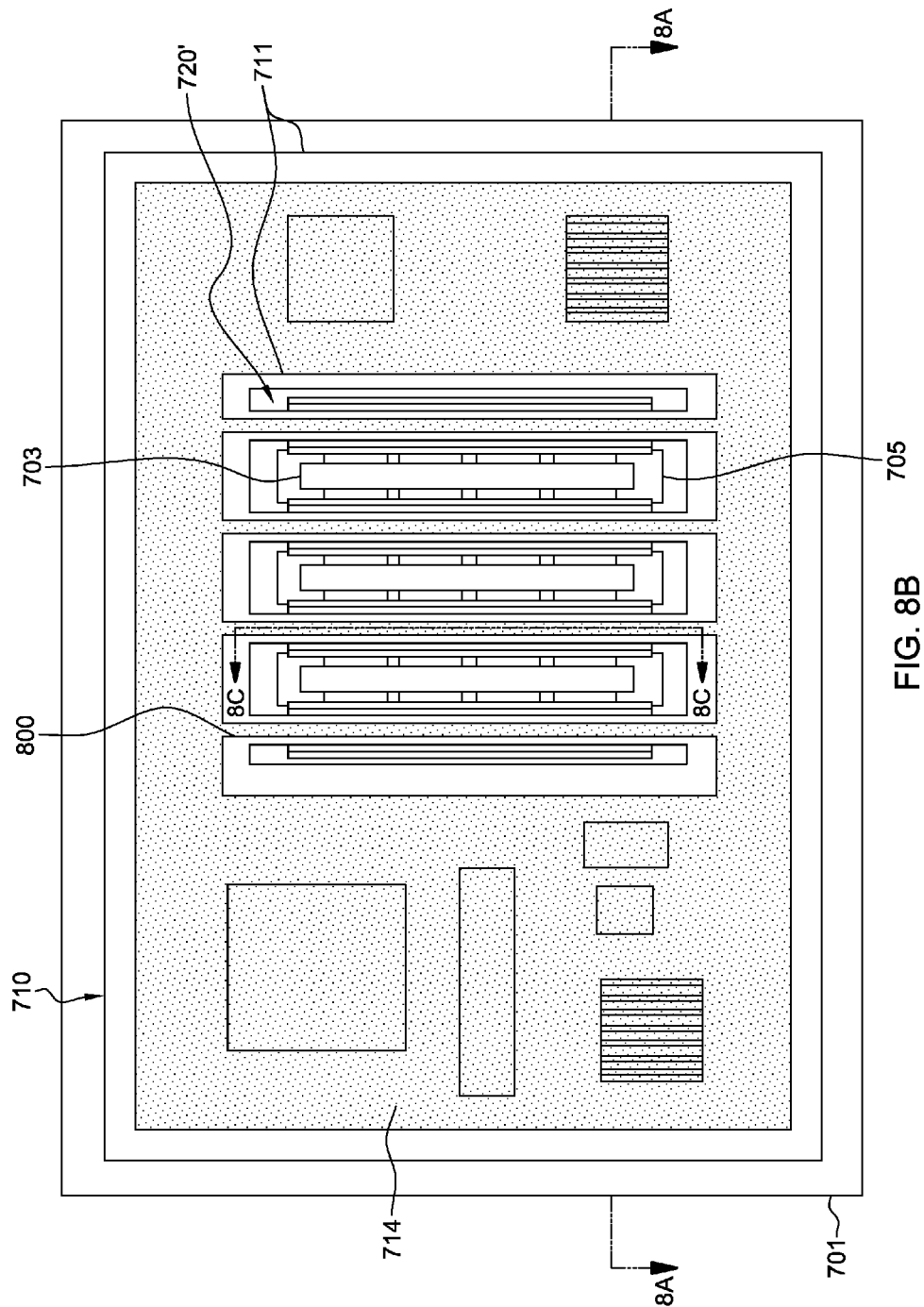

IMMERSION-COOLED AND CONDUCTION-COOLED METHOD FOR ELECTRONIC SYSTEM

CROSS-REFERENCE TO RELATED APPLICATION

This application is a continuation of U.S. Ser. No. 13/684,712, filed Nov. 26, 2012, and entitled "Immersion-Cooled and Conduction-Cooled Electronic System", and which is hereby incorporated herein by reference in its entirety.

BACKGROUND

The power dissipation of integrated circuit chips, and the modules containing the chips, continues to increase in order to achieve increases in processor performance. This trend poses cooling challenges at the module and system levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the capability of the room air-conditioning to effectively handle the load. This is especially true for large installations with "server farms" or large banks of computer racks located close together. In such installations, liquid-cooling is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

In one aspect, a method of facilitating cooling of an electronic system is provided. The method includes providing a cooling apparatus for cooling an electronics board of the electronic system, the electronics board comprising a plurality of electronic components mounted to the electronics board. The cooling apparatus includes an immersion-cooled electronic component section, and a conduction-cooled electronic component section. The immersion-cooled electronic component section includes: an enclosure at least partially surrounding and forming a compartment about multiple electronic components of the plurality of electronic components mounted to the electronics board; and a fluid disposed within the compartment, the multiple electronic components being, at least partially, immersed within the fluid to facilitate immersion-cooling thereof. The conduction-cooled electronic component section includes at least one electronic component of the plurality of electronic components mounted to the electronics board, and the at least one electronic component is indirectly liquid-cooled, at least in part, via conduction of heat from the at least one electronic component.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 8B is a cross-sectional plan view of the cooled electronic system of FIG. 8A, taken along line 8B-8B thereof, in accordance with one or more aspects of the present invention;

DETAILED DESCRIPTION

Figure 1:
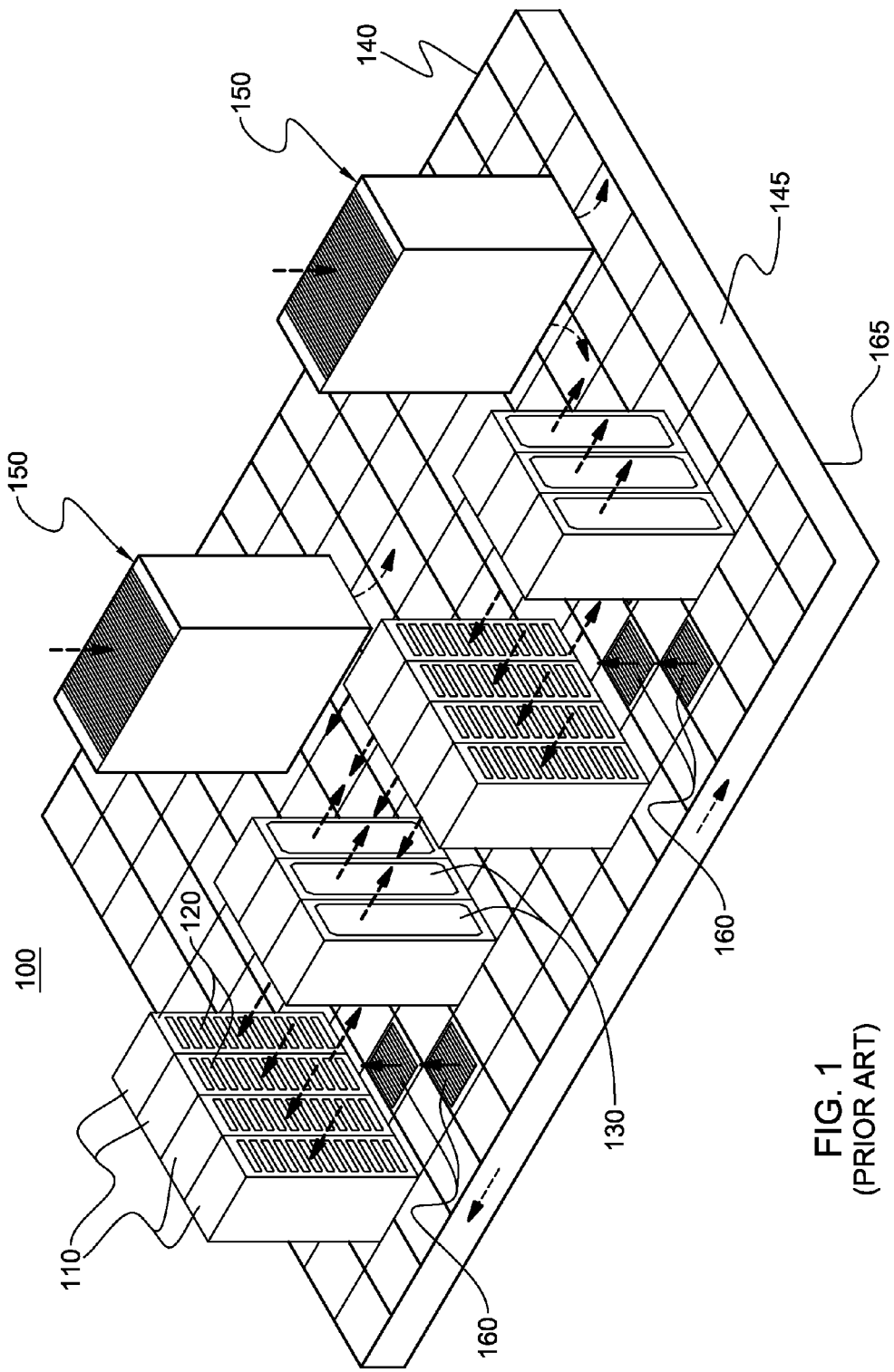
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system, electronic system, or information technology equipment, and may be, for example, a stand alone computer processor having high-, mid- or low-end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed, relative to the electronics rack, with rack-mounted electronic drawers and blades of a blade center system being two examples of electronic systems (or subsystems) of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled cold plate", "liquid-cooled structure", or "liquid-cooled vapor condenser" each refer to a thermally conductive structure having one or more channels or passageways formed therein for flowing of liquid-coolant therethrough.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

By way of further explanation, a "heat pipe" is a heat transfer device which combines the principles of both thermal conductivity and phase transition to effectively manage transfer of heat. A simple type of heat pipe includes a sealed case, an inner surface of which is covered with a layer of capillary or porous material, or structure comprising a wick which is saturated with the working fluid in its liquid phase. At a hot interface within the heat pipe, which may be at a low pressure, a working fluid within the heat pipe in contact with a thermally conductive surface (for example, an inner wall of the casing or a wick), turns into a vapor by absorbing heat from that surface. The working fluid vapor condenses back into a liquid at a cold interface of the heat pipe, releasing the latent heat. The working fluid liquid then returns to the hot interface through, for example, the wick structure by capillary action or gravity, where it evaporates once more and repeats the cycle. Internal pressure within the heat pipe can be set or adjusted to facilitate the phase change, depending on the demands of the working conditions of the cooling system.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or a refrigerant, while still maintaining the advantages and unique features of the present invention.

Reference is made below to the drawings (which are not drawn to scale to facilitate an understanding of the various aspects of the present invention), wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the backs, i.e., air outlet sides 130, of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
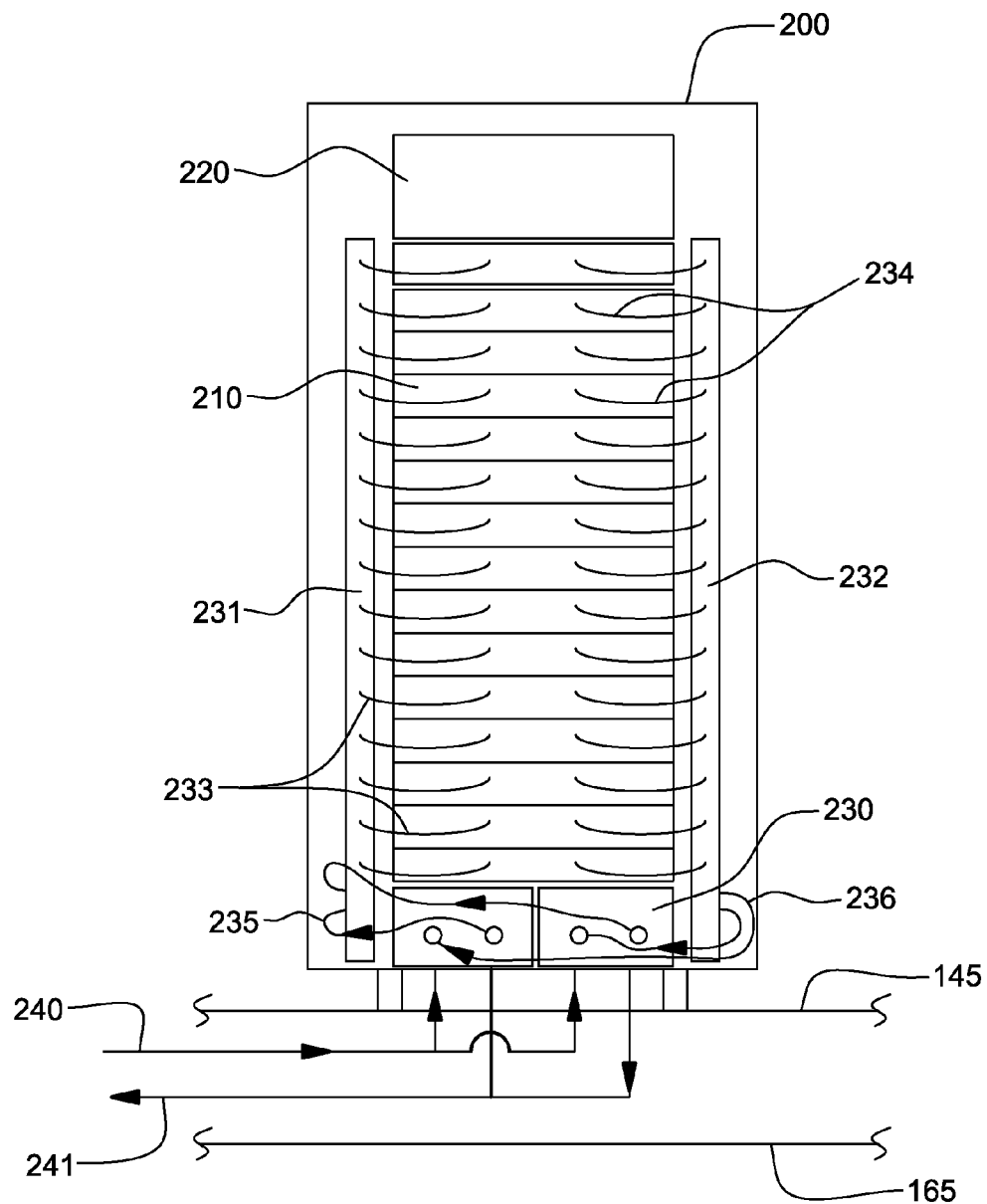
FIG. 2 is a front elevational view of one embodiment of a liquid-cooled electronics rack comprising multiple electronic systems to be cooled via a cooling apparatus, in accordance with one or more aspects of the present invention.

FIG. 2 depicts one embodiment of a liquid-cooled electronics rack 200 comprising a cooling apparatus. In one embodiment, liquid-cooled electronics rack 200 comprises a plurality of electronic systems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic systems. In the embodiments described herein, the system coolant is assumed to be water or an aqueous-based solution, by way of example only.

In addition to MCUs 230, the cooling apparatus depicted includes a system coolant supply manifold 231, a system coolant return manifold 232, and manifold-to-node fluid connect hoses 233 coupling system coolant supply manifold 231 to electronic subsystems 210 (for example, to cold plates or liquid-cooled vapor condensers (see FIGS. 6A-9B) disposed within the systems) and node-to-manifold fluid connect hoses 234 coupling the individual electronic systems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236. Heat load of the electronic systems 210 is transferred from the system coolant to cooler facility coolant within the MCUs 230 provided via facility coolant supply line 240 and facility coolant return line 241 disposed, in the illustrated embodiment, in the space between raised floor 145 and base floor 165.

Figure 3:
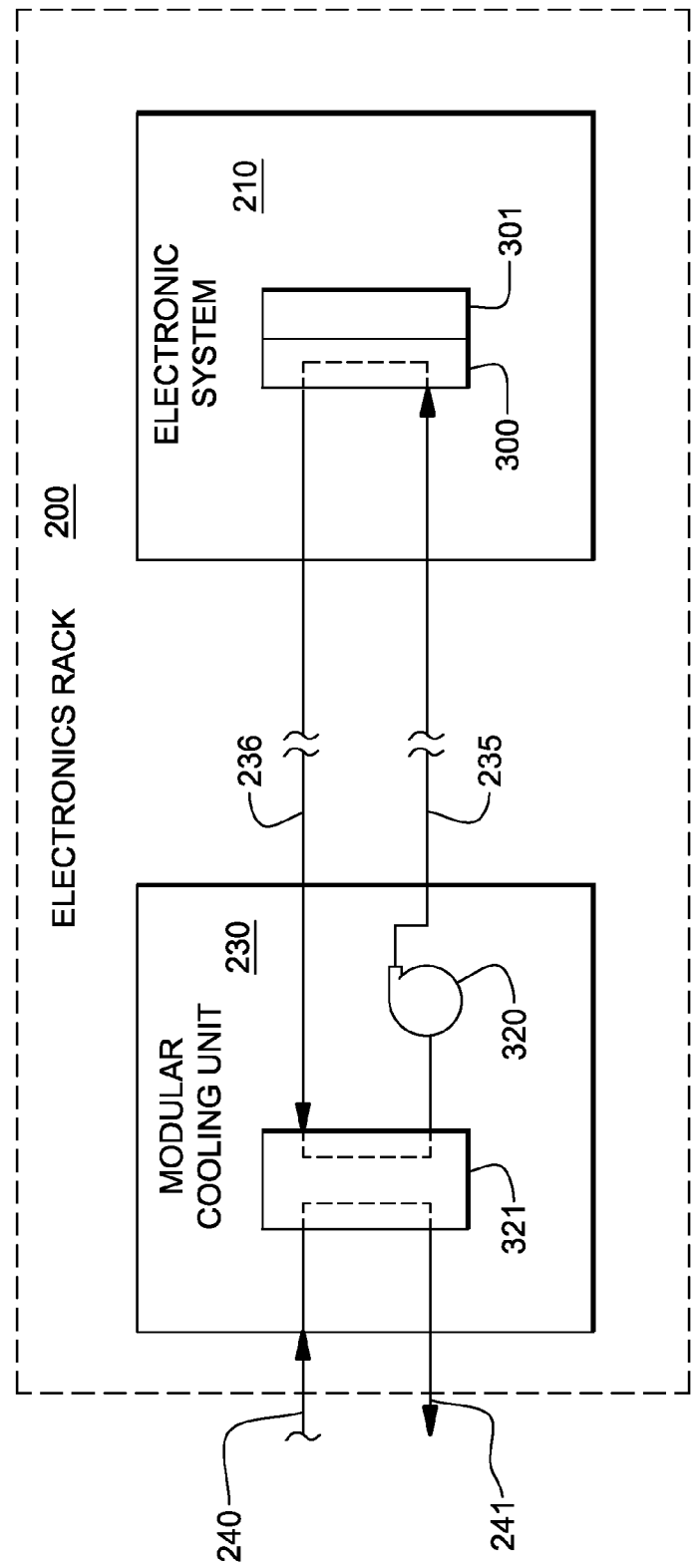
FIG. 3 is a schematic of an electronic system of an electronics rack and one approach to liquid-cooling of an electronic component with the electronic system, wherein the electronic component is indirectly liquid-cooled by system coolant provided by one or more modular cooling units disposed within the electronics rack, in accordance with one or more aspects of the present invention.

FIG. 3 schematically illustrates one cooling approach using the cooling apparatus of FIG. 2, wherein a liquid-cooled cold plate 300 is shown coupled to an electronic component 301 of an electronic system 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic systems. Furthermore, the system coolant is physically separate from the less controlled facility coolant in lines 240, 241, to which heat is ultimately transferred.

Figure 4:
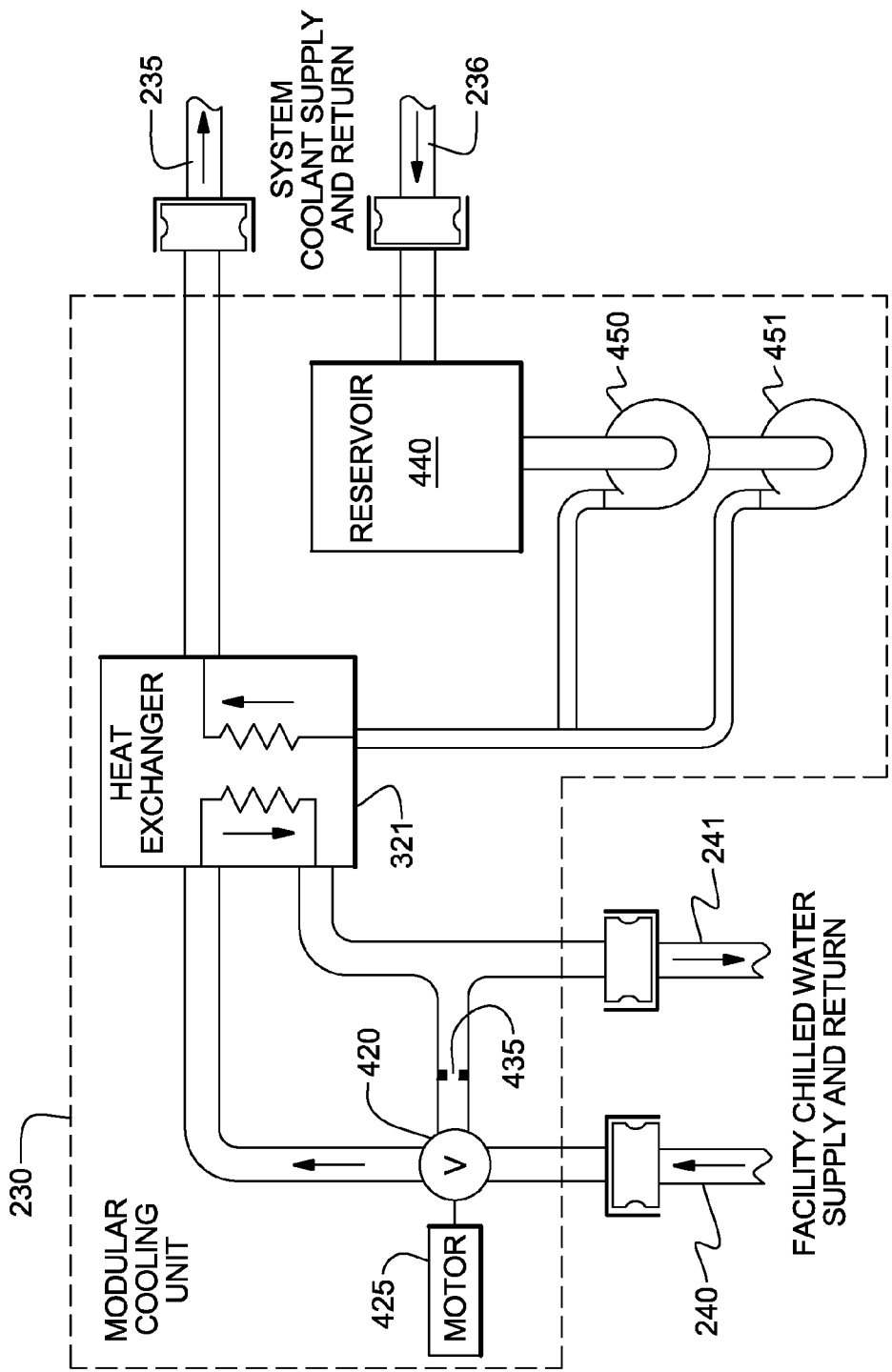
FIG. 4 is a schematic of one embodiment of a modular cooling unit for a liquid-cooled electronics rack such as illustrated in FIG. 2, in accordance with one or more aspects of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
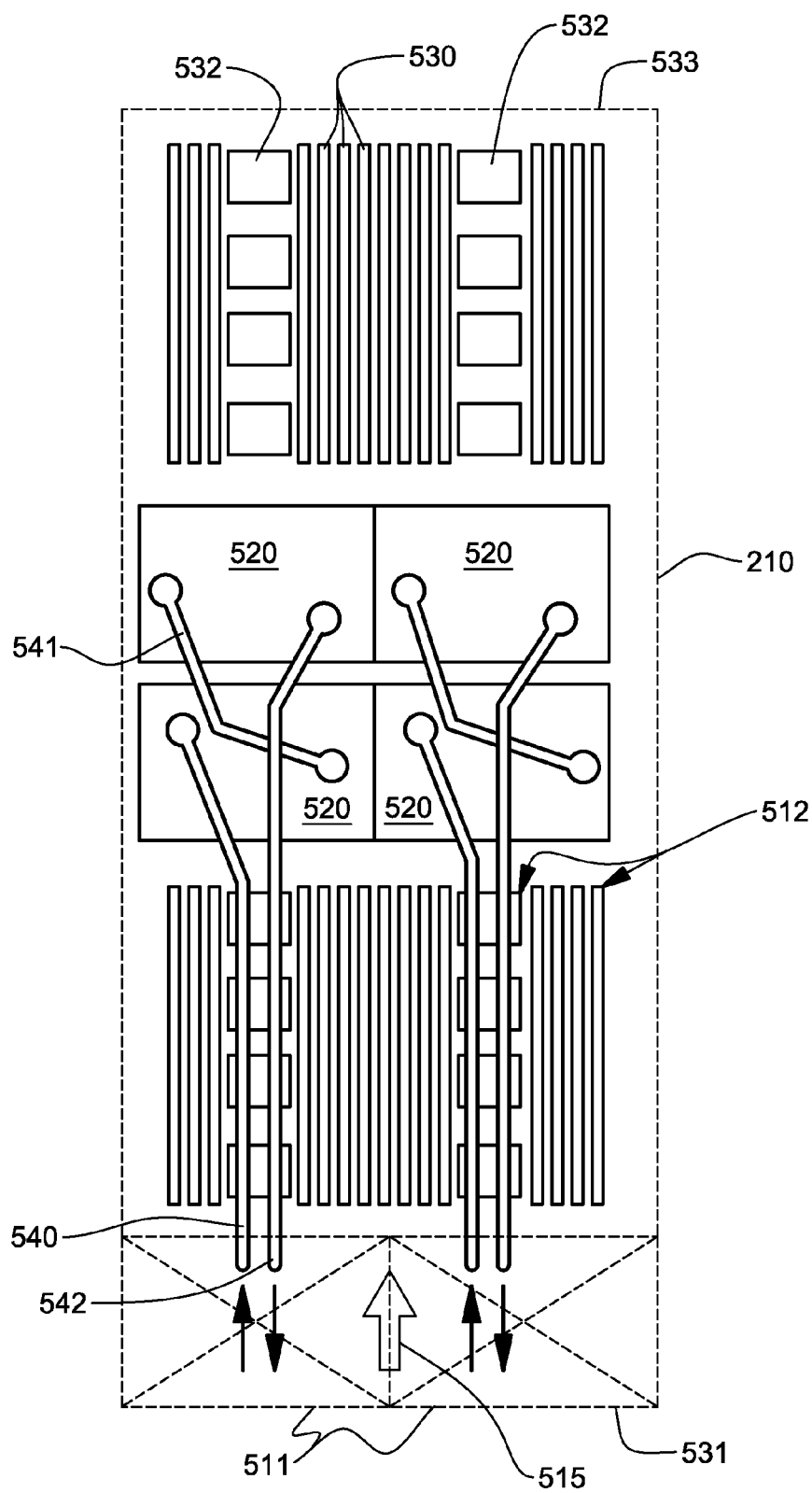
FIG. 5 is a plan view of one embodiment of an electronic system layout illustrating an air and liquid-cooling approach for cooling electronic components of the electronic system, in accordance with one or more aspects of the present invention.

FIG. 5 depicts another cooling approach, illustrating one embodiment of an electronic system 210 component layout wherein one or more air moving devices 511 provide forced air flow 515 in normal operating mode to cool multiple electronic components 512 within electronic system 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic system 210, and partially arrayed near back 533 of electronic system 210. Also, in the embodiment of FIG. 5, memory modules 530 and the memory support modules 532 are cooled by air flow 515 across the electronics system.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

As computing demands continue to increase, heat dissipation requirements of electronic components, such as microprocessors and memory modules, are also rising. This has motivated the development of the application of single-phase, liquid-cooling solutions such as described above. Single-phase, liquid-cooling, however, has some issues. Sensible heating of the liquid as it flows along the cooling channels and across components connected in series results in a temperature gradient. To maintain a more uniform temperature across the heat-generating component, the temperature change in the liquid needs to be minimized. This requires the liquid to be pumped at higher flow rates, consuming more pump power, and thus leading to a less efficient system. Further, it is becoming increasingly challenging to cool all the heat sources on a server or electronic system using pumped liquid, due to the density and number of components, such as controller chips, I/O components and memory modules. The small spaces and number of components to be cooled make liquid plumbing a complex design and fabrication problem and significantly raises the overall cost of the cooling solution.

Immersion-cooling is one possible solution to these issues. In immersion-cooling, typically all components to be cooled are immersed in a dielectric fluid that dissipates heat through boiling. The vapor is then condensed by a secondary, rack-level working (or system) fluid using node or module-level, finned condensers, as explained below.

Direct immersion-cooling of electronic components of an electronic system of the rack unit using dielectric fluid (e.g., a liquid dielectric coolant) advantageously avoids forced air cooling and enables total liquid-cooling of the electronics rack within the data center. Although indirect liquid-cooling, such as described above in connection with FIGS. 3 and 5, has certain advantages due to the low cost and wide availability of water as a coolant, as well as its superior thermal and hydraulic properties, where possible and viable, the use of dielectric fluid immersion-cooling may offer several unique benefits.

For example, the use of a dielectric fluid that condenses at a temperature above typical outdoor ambient air temperature would enable data center cooling architectures which do not require energy intensive refrigeration chillers. Also, the use of liquid immersion-cooling may, in certain cases, allow for greater compaction of electronic components at the electronic subsystem level and/or electronic rack level since conductive cooling structures might be eliminated. Unlike corrosion sensitive water-cooled systems, chemically inert dielectric coolant (employed with an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water-based cooling approach. For at least these potential benefits, dielectric fluid immersion-cooling of one or more electronic systems (or portions of one or more electronic systems) of an electronics rack may offer significant energy efficiency and higher performance cooling benefits, compared with currently available hybrid air and indirect water cooled systems.

In the examples discussed below, the dielectric fluid may comprise any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 6A:
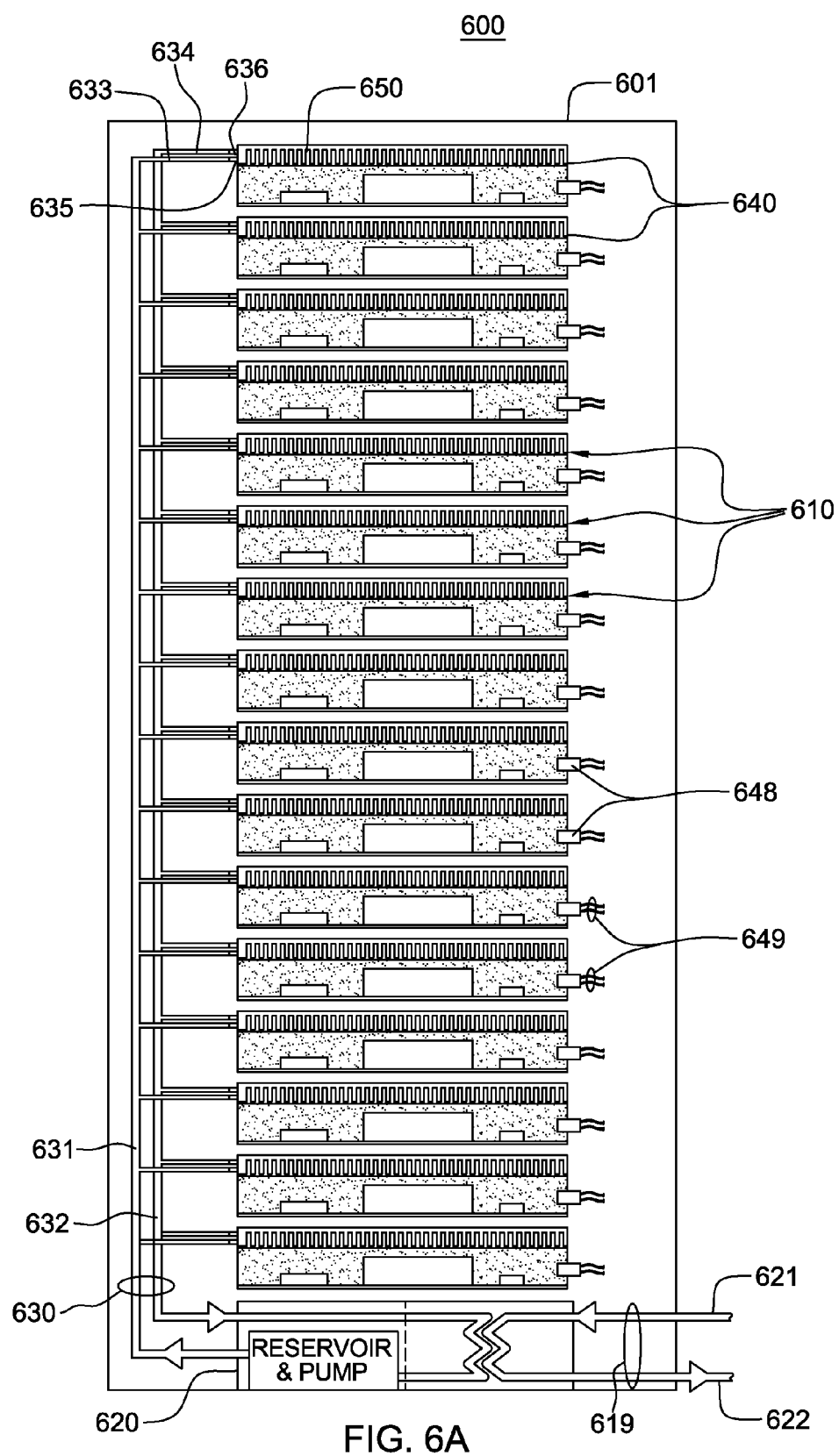
FIG. 6A is an elevational view of an alternate embodiment of a liquid-cooled electronics rack with immersion-cooling of electronic systems thereof, in accordance with one or more aspects of the present invention.

FIG. 6A is a schematic of one embodiment of a liquid-cooled electronics rack, generally denoted 600, employing immersion-cooling of electronic systems, in accordance with an aspect of the present invention. As shown, liquid-cooled electronics rack 600 includes an electronics rack 601 containing a plurality of electronic systems 610 disposed, in the illustrated embodiment, horizontally so as to be stacked within the rack. By way of example, each electronic system 610 may be a server unit of a rack-mounted plurality of server units. In addition, each electronic system includes multiple electronic components to be cooled, which in one embodiment, comprise multiple different types of electronic components having different heights and/or shapes within the electronic system.

The cooling apparatus is shown to include one or more modular cooling units (MCU) 620 disposed, by way of example, in a lower portion of electronics rack 601. Each modular cooling unit 620 may be similar to the modular cooling unit depicted in FIG. 4, and described above. The modular cooling unit includes, for example, a liquid-to-liquid heat exchanger for extracting heat from coolant flowing through a system coolant loop 630 of the cooling apparatus and dissipating heat within a facility coolant loop 619, comprising a facility coolant supply line 621 and a facility coolant return line 622. As one example, facility coolant supply and return lines 621, 622 couple modular cooling unit 620 to a data center facility coolant supply and return (not shown). Modular cooling unit 620 further includes an appropriately sized reservoir, pump and optional filter for moving liquid-coolant under pressure through system coolant loop 630. In one embodiment, system coolant loop 630 includes a coolant supply manifold 631 and a coolant return manifold 632, which are coupled to modular cooling unit 620 via, for example, flexible hoses. The flexible hoses allow the supply and return manifolds to be mounted within, for example, a door of the electronics rack hingedly mounted to the front or back of the electronics rack. In one example, coolant supply manifold 631 and coolant return manifold 632 each comprise an elongated rigid tube vertically mounted to the electronics rack 601 or to a door of the electronics rack.

In the embodiment illustrated, coolant supply manifold 631 and coolant return manifold 632 are in fluid communication with respective coolant inlets 635 and coolant outlets 636 of individual sealed housings 640 containing the electronic systems 610. Fluid communication between the manifolds and the sealed housings is established, for example, via appropriately sized, flexible hoses 633, 634. In one embodiment, each coolant inlet 635 and coolant outlet 636 of a sealed housing is coupled to a respective liquid-cooled vapor condenser 650 disposed within the sealed housing 640. Heat removed from the electronic system 610 via the respective liquid-cooled vapor condenser 650 is transferred from the system coolant via the coolant return manifold 632 and modular cooling unit 620 to facility coolant loop 619. In one example, coolant passing through system coolant loop 630, and hence, coolant passing through the respective liquid-cooled vapor condensers 650 is water.

Note that, in general, fluidic coupling between the electronic subsystems and coolant manifolds, as well as between the manifolds and the modular cooling unit(s) can be established using suitable hoses, hose barb fittings and quick disconnect couplers. In the example illustrated, the vertically-oriented coolant supply and return manifolds 631, 632 each include ports which facilitate fluid connection of the respective coolant inlets and outlets 635, 636 of the housings (containing the electronic subsystems) to the manifolds via the flexible hoses 633, 634. Respective quick connect couplings may be employed to couple the flexible hoses to the coolant inlets and coolant outlets of the sealed housings to allow for, for example, removal of a housing and electronic subsystem from the electronics rack. The quick connect couplings may be any one of various types of commercial available couplings, such as those available from Colder Products Co. of St. Paul, Minn., USA or Parker Hannifin of Cleveland, Ohio, USA.

One or more hermetically sealed electrical connectors 648 may also be provided in each sealed housing 640, for example, at a back surface thereof, for docking into a corresponding electrical plane of the electronics rack in order to provide electrical and network connections 649 to the electronic system disposed within the sealed housing when the electronic system is operatively positioned within the sealed housing and the sealed housing is operatively positioned within the electronics rack.

Figure 6B:
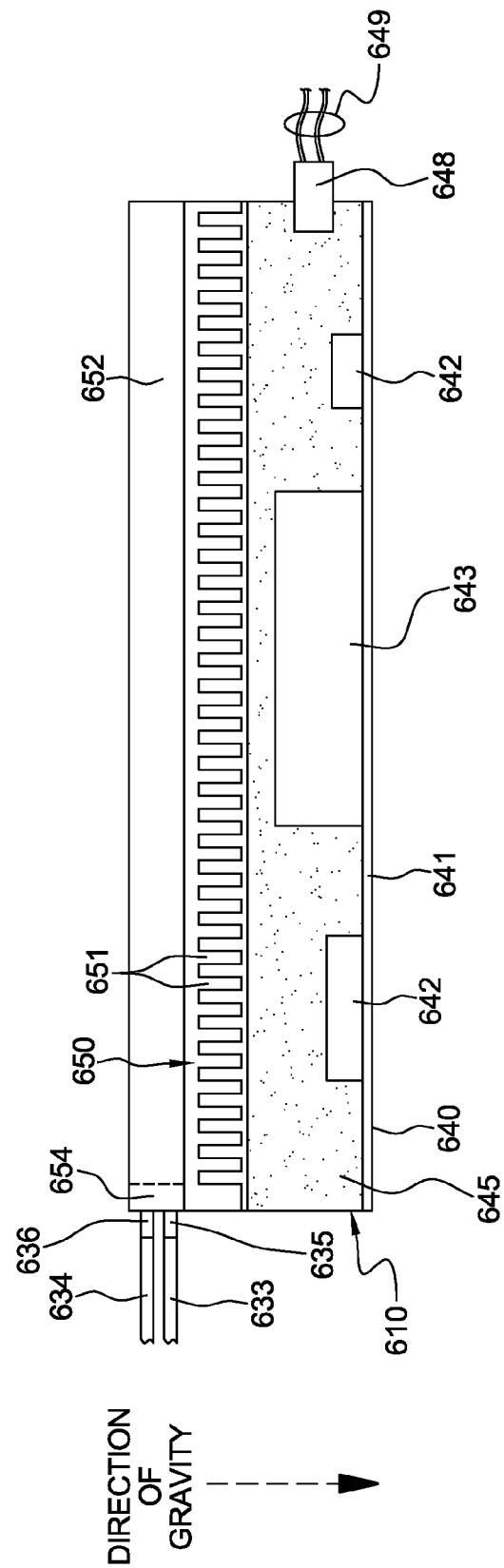
FIG. 6B is a cross-sectional elevational view of one immersion-cooled electronic system of the liquid-cooled electronics rack of FIG. 6A, in accordance with one or more aspects of the present invention.

As illustrated in FIG. 6B, electronic system 610 comprises a plurality of electronic components 642, 643 of different height and type on a substrate 641, and is shown within sealed housing 640 with the plurality of electronic components 642, 643 immersed within a dielectric fluid 645. Sealed housing 640 is configured to at least partially surround and form a sealed compartment about the electronic system with the plurality of electronic components 642, 643 disposed within the sealed compartment. In an operational state, dielectric fluid 645 pools in the liquid state at the bottom of the sealed compartment and is of sufficient volume to submerge the electronic components 642, 643. The electronic components 642, 643 dissipate varying amounts of power, which cause the dielectric fluid to boil, releasing dielectric fluid vapor, which rises to the upper portion of the sealed compartment of the housing.

The upper portion of sealed housing 640 is shown in FIG. 6B to include liquid-cooled vapor condenser 650. Liquid-cooled vapor condenser 650 is a thermally conductive structure which includes a liquid-cooled base plate 652, and a plurality of thermally conductive condenser fins 651 extending therefrom in the upper portion of the sealed compartment. A plenum structure 654 comprises part of liquid-cooled base plate 652, and facilitates passage of system coolant through one or more channels in the liquid-cooled base plate 652. In operation, the dielectric fluid vapor contacts the cool surfaces of the thermally conductive condenser fins and condenses back to liquid phase, dropping downwards towards the bottom of the sealed compartment.

System coolant supplied to the coolant inlet of the housing passes through the liquid-cooled base plate of the liquid-cooled vapor condenser and cools the solid material of the condenser such that condenser fin surfaces that are exposed within the sealed compartment to the dielectric fluid vapor (or the dielectric fluid itself) are well below saturation temperature of the vapor. Thus, vapor in contact with the cooler condenser fin surfaces will reject heat to these surfaces and condense back to liquid form. Based on operating conditions of the liquid-cooled vapor condenser 650, the condensed liquid may be close in temperature to the vapor temperature or could be sub-cooled to a much lower temperature.

Advantageously, in immersion-cooling such as depicted in FIGS. 6A & 6B, all of the components to be cooled are immersed in the dielectric fluid. The system fluid can tolerate a larger temperature rise, while maintaining component temperatures, thus allowing a smaller flow rate, and higher inlet temperatures, improving energy efficiency of the resultant cooling apparatus.

Immersion-cooling of an electronic system, such as a server, may present problems with regards to servicing or replacing in the field one or more of the components of the electronic system, such as one or more memory modules. Servicing/replacing a component with an immersion-cooled electronic system approach, such as described above in connection with FIGS. 6A & 6B, requires that the electronic system be drained, and that the sealed enclosure be opened to access the electronic component(s) to be serviced or replaced. This can be a time consuming and costly procedure.

In accordance with the cooled electronic systems presented herein, examples of which are depicted in FIGS. 7A-9C, a hybrid cooling approach is disclosed, wherein the cooling apparatus includes both an immersion-cooled electronic component section and a conduction-cooled electronic component section, with the one or more electronic components within the conduction-cooled electronic component section being field-replaceable, without requiring draining and opening of the sealed enclosure defining the immersion-cooled electronic component section.

Generally stated, a cooled electronic system is disclosed herein, where an electronics board of the cooled electronic system includes a plurality of electronic components mounted to the board, and a cooling apparatus facilitates cooling of the plurality of electronic components. The cooling apparatus includes an immersion-cooled electronic component section and a conduction-cooled electronic component section. Within the immersion-cooled electronic component section, an enclosure at least partially surrounds and forms a compartment about multiple electronic components of the plurality of electronic components mounted to the electronics board, and a fluid, that is, a dielectric fluid, is disposed within the compartment, and the multiple electronic components are, at least partially, immersed within the fluid to facilitate immersion-cooling thereof. The conduction-cooled electronic component section includes at least one electronic component of the plurality of electronic components mounted to the electronics board, and the at least one electronic component within this section is indirectly liquid-cooled, at least in part, via conduction of heat from the at least one electronic component. Advantageously, the at least one electronic component is field-replaceable, without draining the fluid and opening the enclosure of the immersion-cooled electronic component section. In one specific example, the at least one electronic component of the conduction-cooled electronic component section includes one or more dual-inline memory modules (DIMMs), which may be readily accessed and field-replaced or serviced.

By way of further example, in the hybrid cooling approach disclosed herein, a region (or section) of an electronic system or electronics board which includes one or more field-replaceable components, such as DIMMs, remains outside of the immersion-cooled electronic component section, and more particularly, the enclosure of that section, whereas the balance of the plurality of electronic components mounted to the electronics board are within the immersion-cooled electronic component section and cooled, at least in part, by vaporization of dielectric fluid within the sealed compartment of the immersion-cooled section. The field-replaceable components are instead conduction-cooled, for instance, using any of a variety of conduction-cooling approaches such as described herein.

Figure 7A:
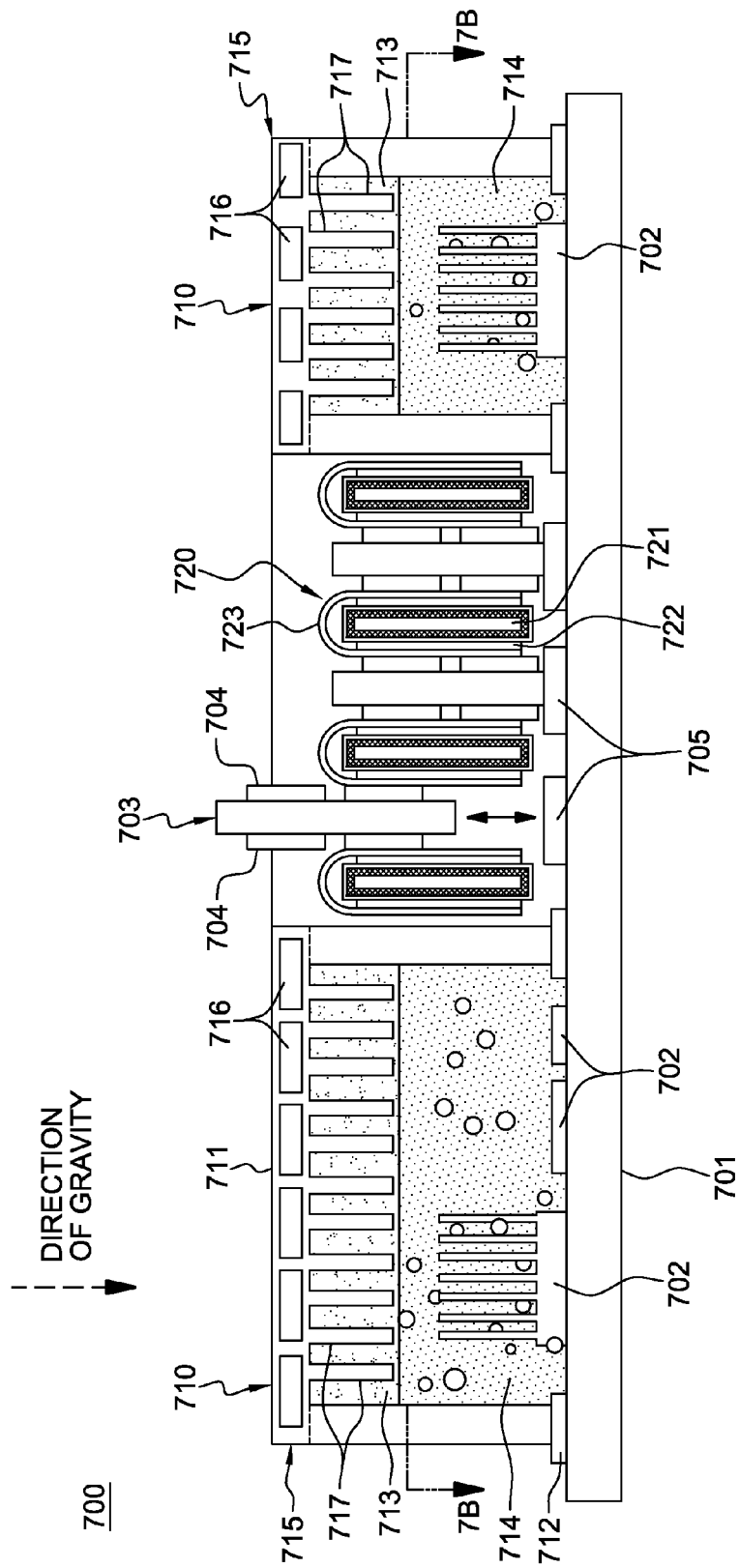
FIG. 7A is a cross-sectional elevational view of one embodiment of a cooled electronic system comprising a cooling apparatus including immersion-cooled and conduction-cooled electronic component sections, taken along line 7A-7A in the plan view of FIG. 7B, in accordance with one or more aspects of the present invention.
Figure 7B:
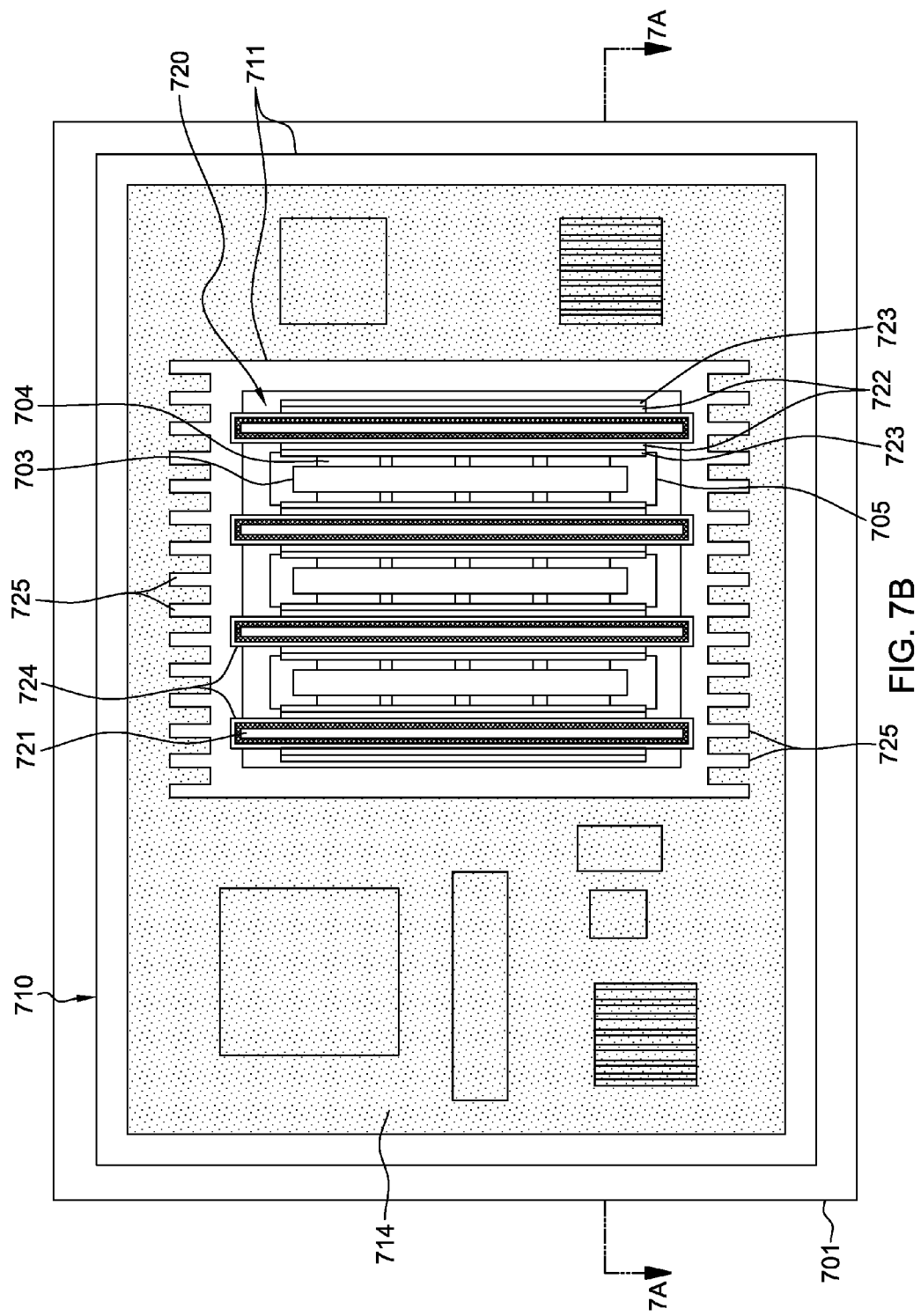
FIG. 7B is a cross-sectional plan view of the cooled electronic system of FIG. 7A, taken along line 7B-7B thereof, in accordance with one or more aspects of the present invention.

A first approach is to employ heat pipes disposed in between the electronic components of the conduction-cooled electronic component section, to make thermal contact with the heated electronic components, and thermally couple the components to the enclosure of the immersion-cooled electronic component section, where the heat conducted away from the field-replaceable electronic component(s) is convected from the enclosure to the dielectric fluid within the immersion-cooled electronic component section. One embodiment of this approach is depicted in FIGS. 7A & 7B.

Figure 8A:
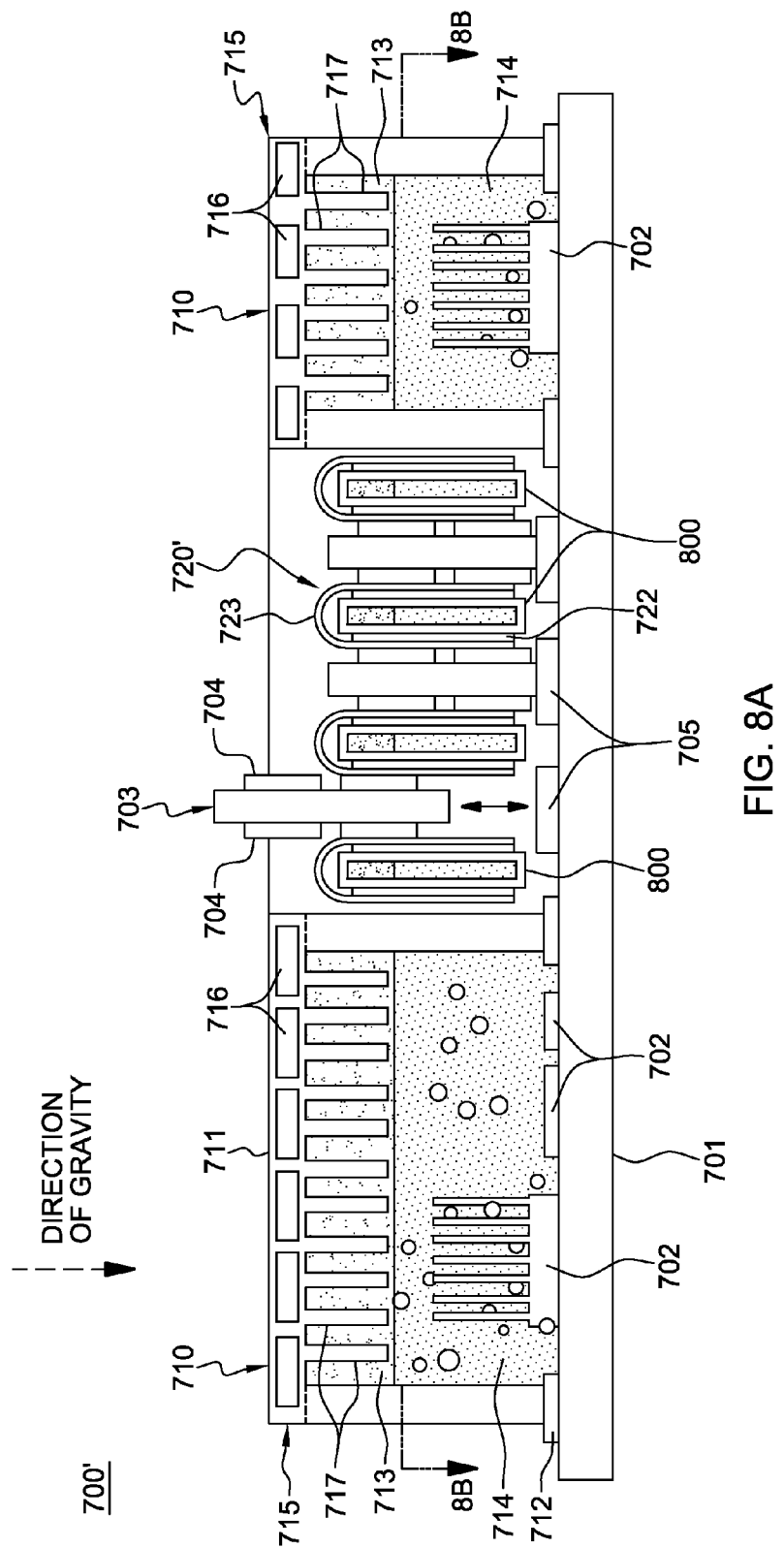
FIG. 8A is a cross-sectional elevational view of another embodiment of a cooled electronic system comprising a cooling apparatus including immersion-cooled and conduction-cooled electronic component sections, taken along line 8A-8A in the plan view of FIG. 8B, in accordance with one or more aspects of the present invention.
Figure 8C:
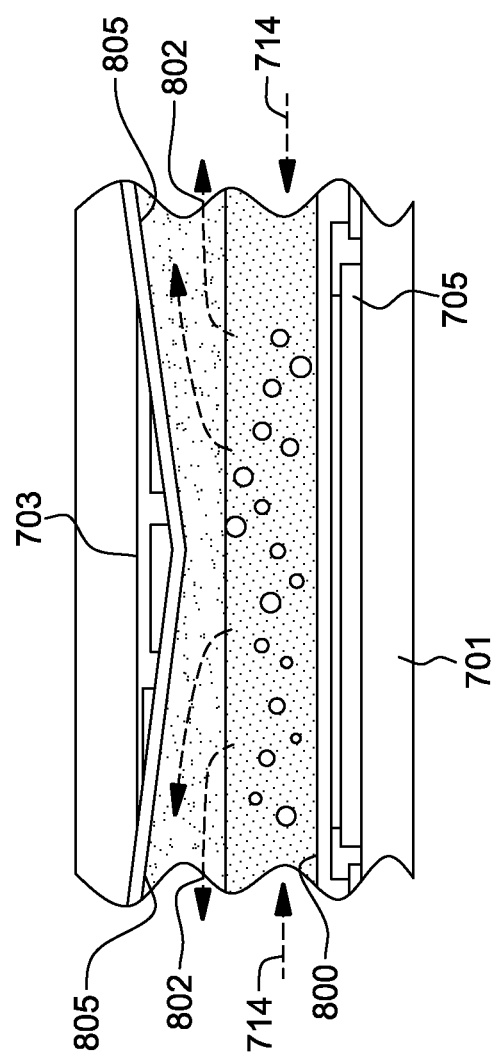
FIG. 8C is a partial cross-sectional elevational view of the cooled electronic system of FIGS. 8A & 8B, taken along line 8C-8C in the plan view of FIG. 8B, in accordance with one or more aspects of the present invention.

In another approach, depicted in FIGS. 8A-8C, heat is conducted away from the field-replaceable electronic components of the conduction-cooled electronic component section employing one or more fluid-containing channels formed integral with, or coupled to, the enclosure of the immersion-cooled electronic component section, and in fluid communication with the compartment of the immersion-cooled electronic component section such that the fluid within the compartment of the immersion-cooled electronic component section is also disposed within the fluid channel(s). Heat from the electronic component(s) of the conduction-cooled electronic component section is thermally conducted to the fluid-containing channels, and by convection, to the fluid within the fluid channel(s), causing the dielectric fluid to vaporize, and the fluid vapor to be transported to the compartment of the immersion-cooled electronic component section, to be condensed back to liquid.

In both of these approaches, the electronic components of the conduction-cooled electronic component section, such as DIMMs, may be designed to be field-replaceable and can be readily inserted into or removed from (for instance) respective sockets mounted to the electronics board, since they are outside of the enclosure of the immersion-cooled electronic component section.

Figure 9A:
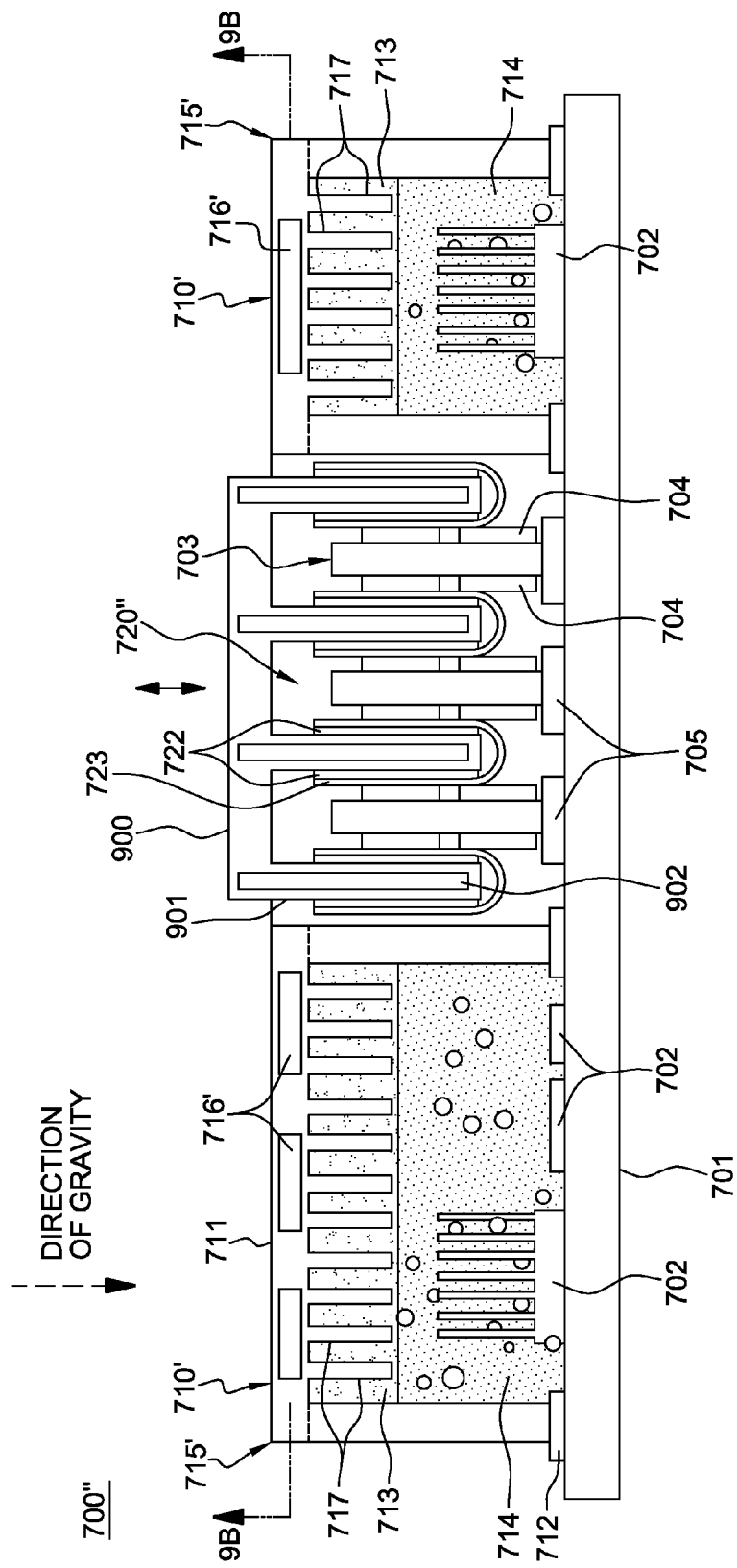
FIG. 9A is a cross-sectional elevational view of another embodiment of a cooled electronic system comprising a cooling apparatus including immersion-cooled and conduction-cooled electronic component sections, and taken along line 9A-9A in the plan view of FIG. 9B, in accordance with one or more aspects of the present invention.
Figure 9B:
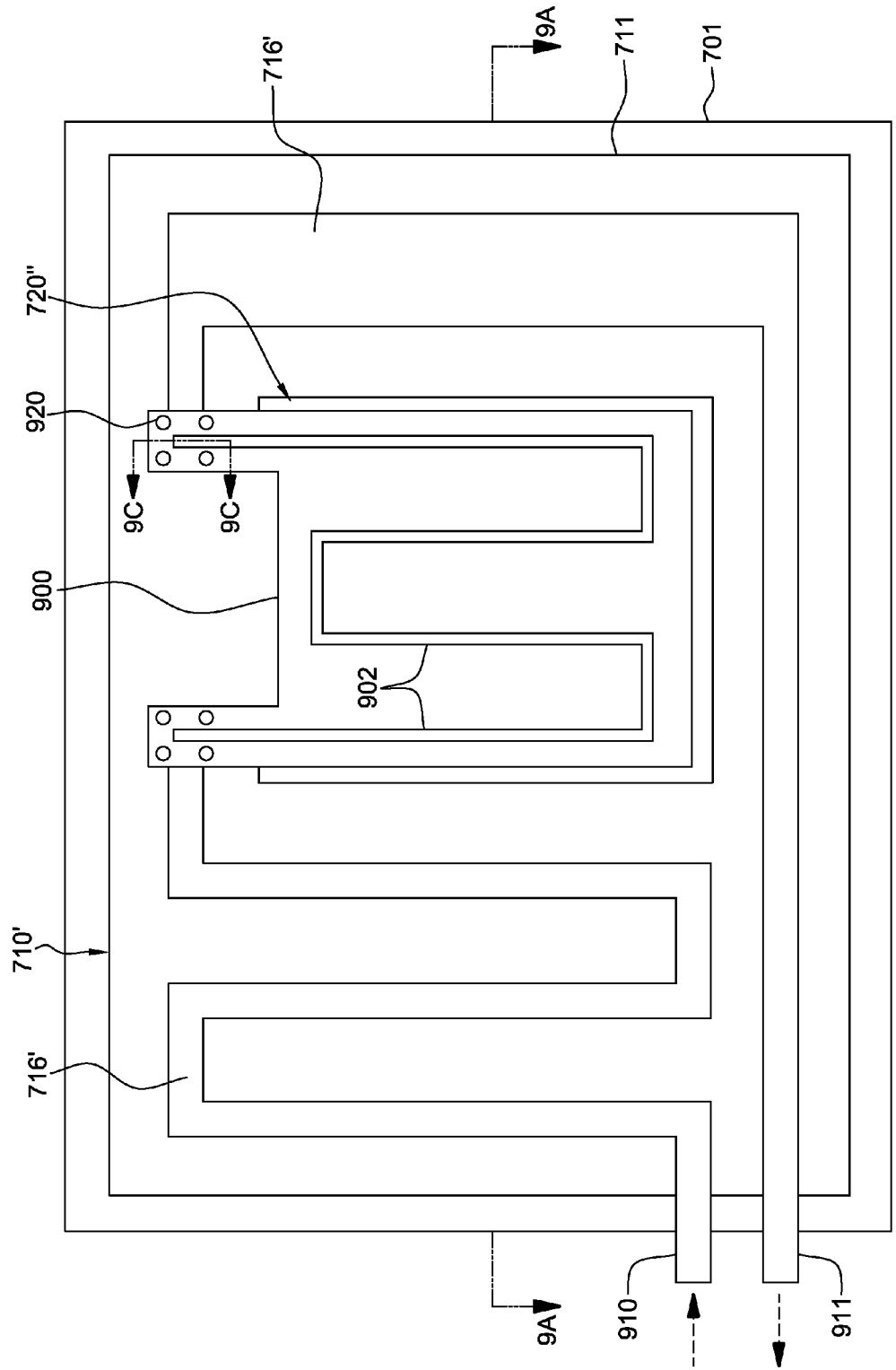
FIG. 9B is a cross-sectional plan view of the cooled electronic system of FIG. 9A, taken along line 9B-9B thereof, in accordance with one or more aspects of the present invention.
Figure 9C:
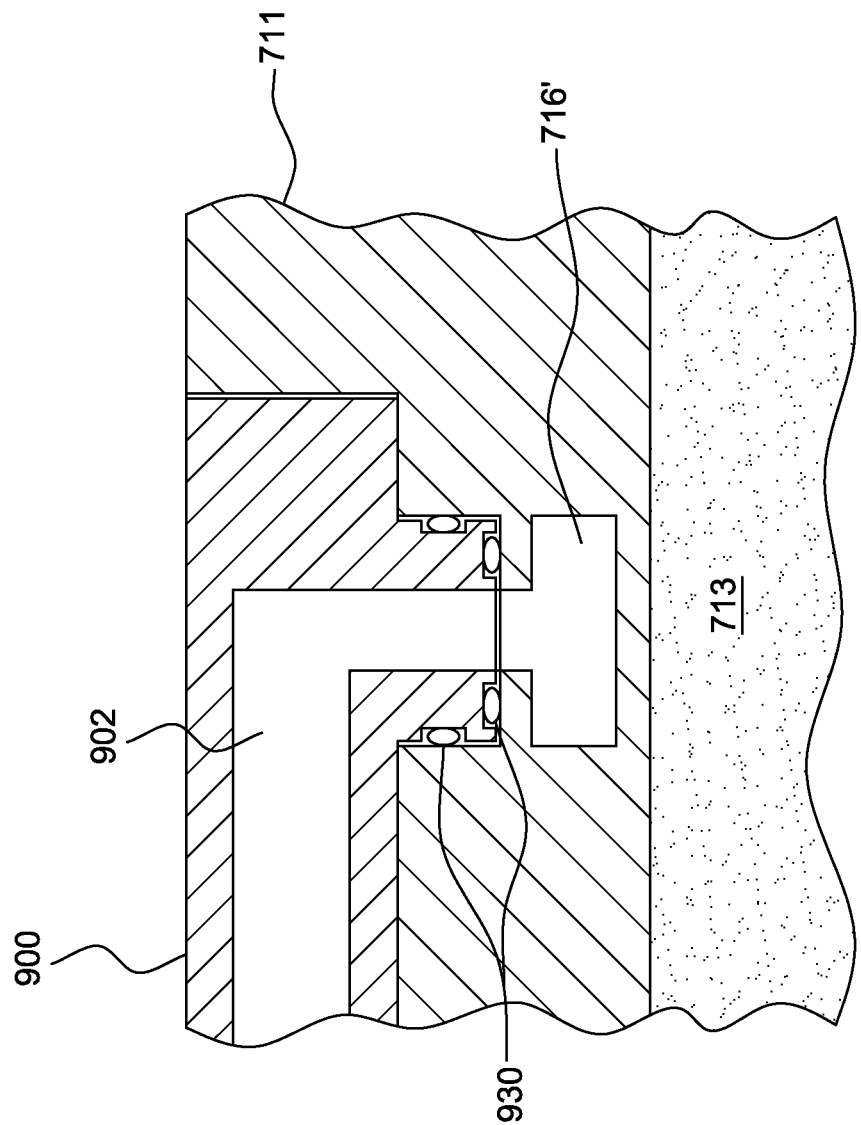
FIG. 9C is a partial cross-sectional elevational view of the cooled electronic system of FIGS. 9A & 9B, taken along line 9C-9C in the plan view of FIG. 9B, in accordance with one or more aspects of the present invention.

In another approach, depicted in FIGS. 9A-9C, a separable liquid-cooled cold plate is provided in association with the conduction-cooled electronic component section. This separate, separable liquid-cooled cold plate is, in one embodiment, fluidically connected to the liquid-cooled vapor condenser associated with the enclosure of the immersion-cooled electronic component section. In one implementation, the separable, liquid-cooled cold plate includes thermally conductive fins, such as coolant-carrying fin structures, which extend downwards, in-between the field-replaceable electronic components (such as DIMMs) mounted to the electronics board. Heat generated by these electronic components is thermally conducted to the liquid-cooled cold plate, where the heat is transferred by convection to liquid coolant flowing through the liquid-cooled cold plate. In one example, this liquid coolant may comprise water.

An advantage of the hybrid cooling apparatuses disclosed herein is the ability to readily insert and remove certain, designated field-replaceable, electronic components (such as DIMMs), from an electronic system, which is also (for example, mostly) enclosed by an immersion-cooling enclosure. This reduces the cost and time associated with replacing the electronic component(s) of the conduction-cooled electronic component section, compared with a cooling apparatus comprising a fully-encapsulated, immersion-cooled electronic component system, such as described above in connection with FIGS. 6A & 6B.

As noted, FIGS. 7A & 7B depict one embodiment of a cooled electronic system, generally denoted 700, in accordance with one or more aspects of the present invention. Referring collectively to FIGS. 7A & 7B, cooled electronic system 700 includes an electronic system comprising an electronics board 701, with a plurality of electronic components 702, 703, 704, mounted thereto. A cooling apparatus is provided which includes an immersion-cooled electronic component section 710, and a conduction-cooled electronic component section 720.

As illustrated, immersion-cooled electronic component section 710 includes an enclosure (or immersion-cooling enclosure) 711, which is sealed via a gasket or other suitable sealing mechanism 712 to electronics board 701, so as to define a fluid-tight compartment 713, which comprises a dielectric fluid 714, such as described above in connection with the immersion-cooling approach of FIGS. 6A & 6B. A liquid-cooled vapor condenser 715 is associated with or integrated with enclosure 711, for instance, in an upper portion thereof, and comprises one or more liquid-carrying channels 716, and a plurality of thermally conductive fins 717 extending into compartment 713 of immersion-cooled electronic component section 710.

As illustrated in FIG. 7B, in one embodiment, the immersion-cooled electronic component section 710 encircles the conduction-cooled electronic component section 720. Within the conduction-cooled electronic component section 720, one or more electronic components 703 are mounted to electronics board 701, for instance, via respective sockets 705. In one example, the electronic components 703 of conduction-cooled electronic component section 720 may comprise DIMMs, each with a plurality of memory modules 704 mounted on opposite sides thereof. Within conduction-cooled electronic component section 720, electronic components 703 are thermally coupled to respective heat pipes 721 via, for instance, thermal pads 722 and guide clips or springs 723. In one implementation, guide clips or springs 723 may comprise metal clips (or springs), rounded to guide the insertion of the adjoining electronic component(s) into its respective socket 705, and thereby facilitate field-replaceability thereof.

As illustrated in the plan view of FIG. 7B, heat pipes 721 are (in one embodiment) physically coupled, for instance, soldered or otherwise thermally attached, to enclosure 711. By way of example, pipe-receiving recesses 724 may be formed in enclosure 711 to accommodate coupling of respective ends of heat pipe 721 to the enclosure 711, as illustrated. In this manner, good thermal conduction is provided from the heat pipes to the enclosure, which in one embodiment is itself thermally conductive, for instance, being fabricated of metal. A plurality of inwardly-extending, thermally conductive fins 725 may be provided, attached to or integrated with enclosure 711, in the regions where heat pipes 721 couple to enclosure 711 to facilitate convection of heat from the heat pipes to the dielectric fluid 714 within compartment 713 of the immersion-cooled electronic component section 710.

In operation, as dielectric fluid absorbs heat in the immersion-cooled electronic component section of the cooling apparatus, it undergoes phase change. This phase change utilizes the fluid's latent heat of vaporization for cooling purposes. The resultant dielectric fluid vapor rises to the upper region of the compartment 713, where the fluid vapor contacts the cool surfaces of the condenser fins 717 in the condensing region. The condensing fins 717 are cooled by means of a thermal conduction coupling to the base of the liquid-cooled vapor condenser 715, and further by convection to coolant (such as water) passing through the coolant-carrying channel(s) 716 of liquid-cooled vapor condenser 715. Subsequent to making contact with the cooled condenser fin surfaces, the dielectric fluid vapor undergoes a second phase change process from vapor to liquid state, and the resultant liquid drops downwards (due to gravity and its relatively higher density compared with the neighboring vapor region). By way of example, the thermally conductive condenser fins 717 might comprise pin fin or plate fin structures. Further, depending on the implementation, the vertical length of the condenser fins may vary.

Simultaneously, heat is conducted from the field-replaceable electronic components of the conduction-cooled electronic component section, through heat pipes 721 to enclosure 711, and subsequently transferred by convection from the fins 725 to dielectric fluid 714 disposed within compartment 713. Thus, in this implementation, the immersion-cooled electronic component section, in addition to cooling the multiple electronic components disposed within the immersion-cooled compartment of that section, also facilitates dissipating heat thermally conducted from the conduction-cooled electronic component section to the enclosure.

As noted, and by way of example only, the field-replaceable electronic components 703 of the conduction-cooled electronic component section depicted in FIGS. 7A & 7B, may comprise dual-in-line memory modules (DIMMs) conduction-cooled via heat pipes attached at their edges to the immersion-cooling enclosure of the immersion-cooled electronic component section of the cooling apparatus. As illustrated in these figures, the remaining electronic components of the electronic system are directly immersion-cooled via contact with the dielectric fluid. Thermal conduction to the heat pipes is facilitated by providing thermal pads attached to the opposing sides of the heat pipes using metal clips or springs. The metal clips (or springs) facilitate smooth removal and insertion of the respective DIMMs, without engaging edges of the heat pipe(s). (The use of a metal spring would also achieve a similar purpose, while providing the added benefit of improved gap-filling.) The heat pipes facilitate conducting heat from the DIMMs to the immersion-cooled enclosure, where the heat is dissipated by convection to the dielectric fluid within the compartment of the immersion-cooed electronic component section.

As noted, FIGS. 8A-8C depict an alternate embodiment of a cooled electronic system, generally denoted 700', in accordance with one or more aspects of the present invention. This cooled electronic system 700' is similar to cooled electronic system 700 described above in connection with FIGS. 7A & 7B, with an exception being that the heat pipes 721 of the embodiment of FIGS. 7A & 7B are replaced by fluid-containing channels 800, coupled in fluid communication with compartment 713 of the immersion-cooling electronic component section 700. These fluid-containing channels 800 could be formed integral with enclosure 711 of the immersion-cooled electronic component section 710, or attached to the enclosure and aligned to respective openings in the enclosure, which allow dielectric fluid from the compartment into the fluid-containing channels.

Referring collectively to FIGS. 8A-8C, the conduction-cooled electronic component section 720', wherein field-replaceable electronic components 703, 704 are provided, as explained above, includes (in this example) multiple fluid-containing channels 800, which comprise, in part, dielectric fluid 714 from compartment 713. These fluid-containing channels 800 include sloped, upper surfaces 805, which facilitate dielectric vapor 802 egressing from the channels. As illustrated in FIG. 8C, liquid dielectric fluid 714 enters the fluid channel(s), where it becomes vaporized and exits as dielectric vapor 802. Vaporization occurs within the fluid channel(s) 800 due to conduction of heat from the adjoining electronic components 703, 704 of the conduction-cooled electronic component section 720'. In the example of FIGS. 8A-8C, the fluid-containing channels 800 are interleaved with the field-replaceable electronic components, for instance, DIMMs.

As in the example described above in connection with FIGS. 7A & 7B, thermal pads 722 are provided, along with metal clips or springs 723, to facilitate good thermal coupling between the removable, field-replaceable electronic components 703, 704, and the fluid-containing channels 800 coupled in fluid communication with compartment 713 of the immersion-cooled electronic component section. In this implementation, as dielectric fluid 714 within the fluid-containing channels 800 vaporizes due to transfer of heat from the field-replaceable electronic components, the components are cooled. The dielectric vapor 802 rises, and due to the sloped, upper surfaces 805 of the channels, is encouraged to flow upwards and outwards into the main compartment 713, and subsequently to the liquid-cooled vapor condenser 715, where it is condensed back into dielectric liquid. By sloping the upper surfaces of the fluid-containing channels 800, a circulation is created, where as dielectric vapor 802 flows outwards from the channel(s) 800, it is replaced by new dielectric liquid 714 flowing into the channel(s) from the compartment 713. In this embodiment, the thermal pads and metal clips/springs provide or facilitate gap-filling and thermal contact between the field-replaceable electronic components 703, 704, and the dielectric fluid-containing channels 800.

FIGS. 9A-9C depict a further embodiment of a cooled electronic system 700", in accordance with one or more aspects of the present invention. This cooled electronic system is again similar to that described above in connection with FIGS. 7A & 7B, with an exception being that the heat pipes 721 of that embodiment are replaced by a separable liquid-cooled cold plate 900. Referring collectively to FIGS. 9A-9C, in this embodiment, liquid-cooled cold plate 900 includes a plurality of thermally conductive fins 901, such as coolant-carrying fin structures, extending therefrom. Also, in this embodiment, the coolant-carrying channels 716 of the liquid-cooled vapor condenser 715 of FIGS. 7A & 7B, are modified, for instance, enlarged, into a single flow path or channel 716' in the liquid-cooled vapor condenser 715' of FIGS. 9A-9C.

With the depicted cooling approach, the field-replaceable electronic components 703, 704 are first docked within their respective sockets 705 mounted to electronics board 701, and then liquid-cooled cold plate 900 is positioned over the electronic components, in fluid communication with the coolant-carrying channel 716' of liquid-cooled condenser 715' of the immersion-cooled electronic component section of the cooling apparatus. As illustrated in FIG. 9A, in one embodiment, the thermally conductive fins 901 which extend from the liquid-cooled cold plate 900 comprise one or more coolant-carrying channels 902 disposed within the respective coolant-carrying fins structures. These fins 901 project downwards, into the space between the field-replaceable electronic components 703, and are coupled in thermal communication with the electronic components 703, 704, for instance, employing thermal pads 722 and metal clips/springs 723, such as described above. However, note that in this embodiment, the metal clips/springs 723 are inverted to facilitate the insertion and removal of the liquid-cooled cold plate 900, with the field-replaceable electronic components 703 already disposed in operative position on electronics board 701.

As depicted in the partial cross-sectional view of FIG. 9C, fluid communication is achieved (in one embodiment) by interlocking liquid-carrying cold plate 900 with enclosure 711 such that the coolant-carrying channel(s) 902 through liquid-cooled cold plate 900 is in fluid communication with the liquid-cooled channel 716' of liquid-cooled vapor condenser 715' (see FIG. 9A). As shown in FIG. 9B, the secondary liquid coolant may be provided to the cooling apparatus via a coolant inlet 910 and coolant outlet 911, coupled in fluid communication with the coolant-carrying channel 716' of the liquid-cooled vapor condenser. In this embodiment, the coolant-carrying channel 716' of the liquid-cooled vapor condenser of the immersion-cooled electronic component section 710', is coupled in series fluid communication with the coolant-carrying channel(s) 902 of the liquid-cooled cold plate 900 associated with the conduction-cooled electronic component section 720". One or more O-ring seals 930 may be provided at the interface between the liquid-cooled cold plate 900 and the enclosure 711 to facilitate a fluid-tight connection between the coolant-carrying channel 716' of the liquid-cooled vapor condenser 715', and the coolant-carrying channel(s) 902 of the coolant-cooled cold plate 900.

Note that in operation, in this embodiment, heat is conducted from the field-replaceable electronic components 703, 704, directly to the secondary coolant, for instance, water, flowing through the liquid-cooled cold plate 900, and in order to field-replace an electronic component from the conduction-cooled electronic component section 720", the secondary coolant is first drained, the liquid-cooled cold plate 900 is removed, and then the field-replaceable electronic component 703, 704 can be readily removed for servicing or replacement. Once the operation has been completed, the liquid-cooled cold plate 900 is re-attached to the liquid-cooled vapor condenser of the immersion-cooled electronic component section 710' of the cooling apparatus. Attachment mechanisms, such as screws 920, may be employed to securely fasten the liquid-cooled cold plate to enclosure 711 of the immersion-cooled electronic component section. Additional attachment mechanisms (not shown) may be used at other points on the separable liquid-cooled cold plate 900, to secure it in position, for instance, to the underlying electronics board 701, or to other points of the surrounding enclosure 711 of the immersion-cooled electronic component section.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of facilitating cooling of an electronic system, the method comprising:
providing a cooling apparatus for cooling an electronics board of the electronic system, the electronics board comprising a plurality of electronic components mounted to the electronics board, and the cooling apparatus comprising:
an immersion-cooled electronic component section comprising:
an enclosure at least partially surrounding and forming a compartment about multiple electronic components of the plurality of electronic components mounted to the electronics board; and
a fluid disposed within the compartment, the multiple electronic components being, at least partially, immersed within the fluid to facilitate immersion-cooling thereof; and
a conduction-cooled electronic component section external to the enclosure of the immersion-cooled electronic component section, the conduction-cooled electronic component section comprising at least one electronic component of the plurality of electronic components mounted to the electronics board, and the at least one electronic component being non-immersion cooled and indirectly liquid-cooled, at least in part, via conduction of heat from the at least one electronic component.

2. The method of claim 1, wherein the immersion-cooled electronic component section surrounds the conduction-cooled electronic component section.

3. The method of claim 1, wherein the at least one electronic component indirectly liquid-cooled in the conduction-cooled electronic component section comprises at least one field-replaceable electronic component, the at least one field-replaceable electronic component being replaceable without opening the enclosure of the immersion-cooled electronic component section.

4. The method of claim 3, wherein the at least one field-replaceable electronic component comprises at least one field-replaceable memory module.

5. The method of claim 1, wherein the conduction-cooled electronic component section comprises at least one heat pipe disposed between the at least one electronic component of the conduction-cooled electronic component section and the enclosure of the immersion-cooled electronic component, the conduction-cooled electronic component being physically coupled to the enclosure of the immersion-cooled electronic component section via the at least one heat pipe, the at least one heat pipe facilitating thermal conduction from the at least one electronic component of the conduction-cooled electronic component section to the enclosure of the immersion-cooled electronic comment section, and via convection to the fluid disposed within the compartment of the immersion-cooled electronic component section.

6. The method of claim 5, wherein the immersion-cooled electronic component section further comprises a liquid-cooled vapor condenser associated with the enclosure and facilitating condensing of fluid vapor within the compartment, and thereby cooling of the multiple electronic components of the immersion-cooled electronic component section, and indirectly, the at least one electronic component of the conduction-cooled electronic component section via thermal conduction from the at least one electronic component to the at least one heat pipe, and from the at least one heat pipe to the enclosure of the immersion-cooled electronic component section, and then via convection to the fluid within the compartment.

7. The method of claim 6, wherein the enclosure further comprises a plurality of thermally conductive fins projecting into the compartment in a region where the conduction-cooled electronic component section physically couples to the enclosure via the at least one heat pipe, the plurality of thermally conductive fins facilitating transfer of heat, conducted from the at least one heat pipe to the enclosure, to the fluid within the compartment of the immersion-cooled electronic component section.

8. The method of claim 5, further comprising providing at least one thermal pad coupled to the at least one electronic component of the conduction-cooled electronic component section, and disposed between the at least one electronic component of the conduction-cooled electronic component section and the at least one heat pipe, the at least one thermal pad facilitating conduction of heat from the at least one electronic component to the at least one heat pipe.

9. The method of claim 1, wherein the enclosure of the immersion-cooled electronic component section further comprises at least one fluid channel extending into the conduction-cooled electronic component section, and coupled in fluid communication with the compartment of the immersion-cooled electronic component section, the at least one electronic component of the conduction-cooled electronic component section being coupled to the at least one fluid channel to facilitate thermal conduction of heat from the at least one electronic component of the conduction-cooled electronic component section to the at least one fluid channel extending from the enclosure of the immersion-cooled electronic component section.

10. The method of claim 9, wherein the immersion-cooled electronic component section further comprises a liquid-cooled vapor condenser associated with the enclosure and facilitating condensing of fluid vapor within the compartment, and thereby cooling of the multiple electronic components of the immersion-cooled electronic component section, and indirectly, the at least one electronic component of the conduction-cooled electronic component section via thermal conduction from the at least one electronic component to the at least one fluid channel extending from the enclosure of the immersion-cooled electronic component section, and hence to the fluid within the at least one fluid channel of the enclosure.

11. The method of claim 10, wherein the at least one fluid channel comprises at least one sloped surface which facilitates fluid vapor egressing from the at least one fluid channel into the compartment, and hence, to the liquid-cooled vapor condenser of the immersion-cooled electronic component section.

12. The method of claim 1, wherein the conduction-cooled electronic component section further comprises a liquid-cooled cold plate and at least one thermally conductive fin extending from the liquid-cooled cold plate, the at least one electronic component of the conduction-cooled electronic component section being coupled to the at least one thermally conductive fin extending from the liquid-cooled cold plate to facilitate thermal conduction from the at least one electronic component of the conduction-cooled electronic component section to the liquid-cooled cold plate.

13. The method of claim 12, wherein the at least one thermally conductive fin extending from the liquid-cooled cold plate comprises at least one liquid-carrying fin structure extending from the liquid-cooled cold plate, and wherein the immersion-cooled electronic component section further comprises a liquid-cooled vapor condenser associated with the enclosure and facilitating condensing of fluid vapor within the compartment, and thereby cooling of the multiple electronic components of the immersion-cooled electronic component section, the liquid-cooled cold plate and the liquid-cooled vapor condenser being coupled in fluid communication.

14. The method of claim 13, wherein the liquid-cooled vapor condenser and the liquid-cooled cold plate are coupled in series fluid communication.

15. The method of claim 13, wherein liquid coolant flows through a first portion of the liquid-cooled vapor condenser, then through the liquid-cooled cold plate, before flowing through a second portion of the liquid-cooled vapor condenser.

\* \* \* \* \*